(12) United States Patent
Williamson

(10) Patent No.: US 6,194,973 B1
(45) Date of Patent: *Feb. 27, 2001

(54) OSCILLATOR WITH AUTOMATIC GAIN CONTROL

(75) Inventor: Thomas A. Williamson, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/087,335

(22) Filed: May 29, 1998

(51) Int. Cl.$^7$ .................................................. H03B 5/00
(52) U.S. Cl. ........................ 331/109; 331/183; 331/74; 331/177 R; 331/36 C
(58) Field of Search .............................. 331/74, 109, 183, 331/158, 36 C, 177 R, 179

(56) References Cited

U.S. PATENT DOCUMENTS

| | | | |
|---|---|---|---|
| 3,649,929 | * 3/1972 | Thompson | 331/61 |
| 4,479,259 | * 10/1984 | Fenk | 331/109 |
| 5,036,294 | 7/1991 | McCaslin | 331/1 A |
| 5,084,685 | 1/1992 | Möller et al. | 331/1 A |
| 5,446,420 | 8/1995 | Westwick | 331/179 |
| 5,543,761 | 8/1996 | Klughart . | |
| 5,834,983 | * 11/1998 | Higgins, Jr. | 331/109 |

OTHER PUBLICATIONS

Vittoz, Eric A., et al., "High–Performance Crystal Oscillator Circuits: Theory and Application," *IEEE Journal of Solid–State Circuits*, vol. 23, No. 3, Jun. 1988, pp. 774–783.

Huang, Qiuting et al., "A 200 $\mu$A, 78MHz CMOS Crystal–Oscillator Digitally Trimmable to 0.3 PPM," Swiss Federal Institute of Technology, Integrated Systems Laboratory, 1996, pp. 305–308.

Qiuting, Huang, et al., "Design and Implementation of a CMOS VCXO for FM Stereo Decoders," *IEEE Journal of Solid–State Circuits*, vol. 23, No. 3, Jun. 1988, pp. 784–793.

Lee, Yuji et al., "A Wide Variable Range VCXO For IC," *IEEE International Frequency Control Symposium*, Jun. 5–7, 1996, IEEE Catalog No. 96CH35935, pp. 722–727.

Methot, Francois (RadioSysteme, Inc.), "A Simple Clock and PSK Carrier Recovery Circuit," *RF Design Awards*, May 1991, pp. 58–59.

* cited by examiner

*Primary Examiner*—Arnold Kinkead
(74) *Attorney, Agent, or Firm*—Blakely, Sokoloff, Taylor & Zafman LLP

(57) ABSTRACT

An oscillator having an adjustable gain circuit provides abundant gain when the oscillator is first powered up but reduces the gain substantially below its start-up value once oscillations build up, thereby substantially reducing the power consumed. The oscillator comprises an inverting amplifier coupled to a resonator, an oscillation detector coupled to the inverting amplifier amplifier, and a common-gate amplifier coupled to the oscillation detector. The inverting amplifier amplifies oscillations of the resonator according to a gain. The oscillation detector outputs a detection signal in response to oscillations of the resonator. The level of the detection signal is proportional to the amplitude of the oscillations. The common-gate amplifier receives the detection signal and, in response, limits the current to the inverting amplifier to control the gain based on the level of the detection signal.

13 Claims, 16 Drawing Sheets

OSCILLATOR WITH AUTOMATIC GAIN CONTROL

FIELD OF THE INVENTION

The present invention pertains to the field of oscillators and clock generators. More particularly, the present invention relates to gain control of an oscillator.

BACKGROUND OF THE INVENTION

An oscillator with an adjustable ("pullable") output frequency is useful in many applications. In a conventional crystal-based oscillator, the output frequency is a function of the load capacitance seen by the crystal. To make the output frequency adjustable, therefore, the load capacitance can be made variable. A variable capacitance is often provided by a varicap, i.e., a diode which is designed to provide a wide range of junction capacitance within a narrow range of reverse voltages. The reverse voltage controls the frequency and is often generated by a digital-to-analog converter.

One problem with this technique is that the varicap is not available in digital processes. Consequently, the varicap and supporting circuitry are provided externally. To build this type of oscillator using only one varicap requires a type of circuit that is not easily integrated in a digital Complementary Metal-Oxide-Semiconductor (CMOS) process, because it requires floating capacitors (i.e., capacitors which have neither end coupled to Vcc or Vss).

Another problem associated with certain prior art oscillators is that they tend to waste power. To ensure proper start-up under all conditions, many prior art oscillators are designed to have excess gain, beyond what is needed to start and maintain oscillation in most situations. As a result, the oscillation amplitude increases until limited by non-linearities and usually exceeds the supply voltage. This level of drive wastes power, which can be particularly problematic in battery-powered applications. Further, this approach stresses the crystal. This approach also complicates integration of the required load capacitances in a digital CMOS process, due to the wide voltage swing across the capacitors. Consequently, external capacitors are normally provided.

SUMMARY OF THE INVENTION

The present invention includes an oscillator having an adjustable gain. The oscillator includes a first amplifier, a second amplifier, and an oscillation detector. The first amplifier can be coupled to a resonator to amplify oscillations of the resonator according to a gain. The oscillation detector is coupled to the first amplifier and outputs a detection signal in response to oscillations of the resonator. The second amplifier is coupled to receive the detection signal and to provide feedback to the first amplifier to control the gain based on a level of the detection signal. Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A technique for providing an oscillator with all-digital frequency control and automatic gain control is described. As is described in greater detail below, the oscillator includes a variable load capacitance coupled to a resonator, such as a quartz crystal. The variable capacitance is provided in the form of two banks of switchable capacitors, which are controlled by a shift register. The shift register is operable to control the switching states of the switchable capacitors, such that the logic state of each bit of the shift register determines the switching state of one corresponding switchable capacitor from each of the two banks. By clocking the bits of the shift register left or right, the load capacitance is varied, resulting in adjustment of the output frequency of the oscillator.

In addition, the oscillator can be provided with automatic gain control (i.e., self-adjusting gain) to achieve low power consumption. More specifically, an automatic gain control circuit provides abundant gain when the oscillator is first powered up but reduces the gain substantially below its startup value once oscillations build up, thereby substantially reducing the current drawn. In accordance with the present invention, the automatic gain control can (but is not required to) be combined with the digital frequency control, as will be apparent from the description which follows.

In one exemplary embodiment, an oscillation circuit is a pullable crystal oscillator. Throughout this description, numerous references are made to this "exemplary embodiment", along with specific values for certain components and parameters associated with it. Note, however, that many, if not all, of these specific values may be changed for alternative embodiments of the present invention.

The oscillator of the exemplary embodiment operates at a frequency of 24.576 MHz ±100 ppm and draws approximately 0.6 mW of power in steady-state with approximately 8 pF load capacitance on the crystal. The frequency is determined mainly by the crystal but is pullable to approximately ±100 ppm using the arrangement of switchable capacitors. No external components are required except for the crystal, and the frequency is pulled by purely digital logic. Low power consumption is achieved by an automatic gain control circuit that detects oscillations and reduces the current from its startup value of approximately 1 mA to a level that just sustains oscillation, i.e., approximately 200 μA.

Figure 1:
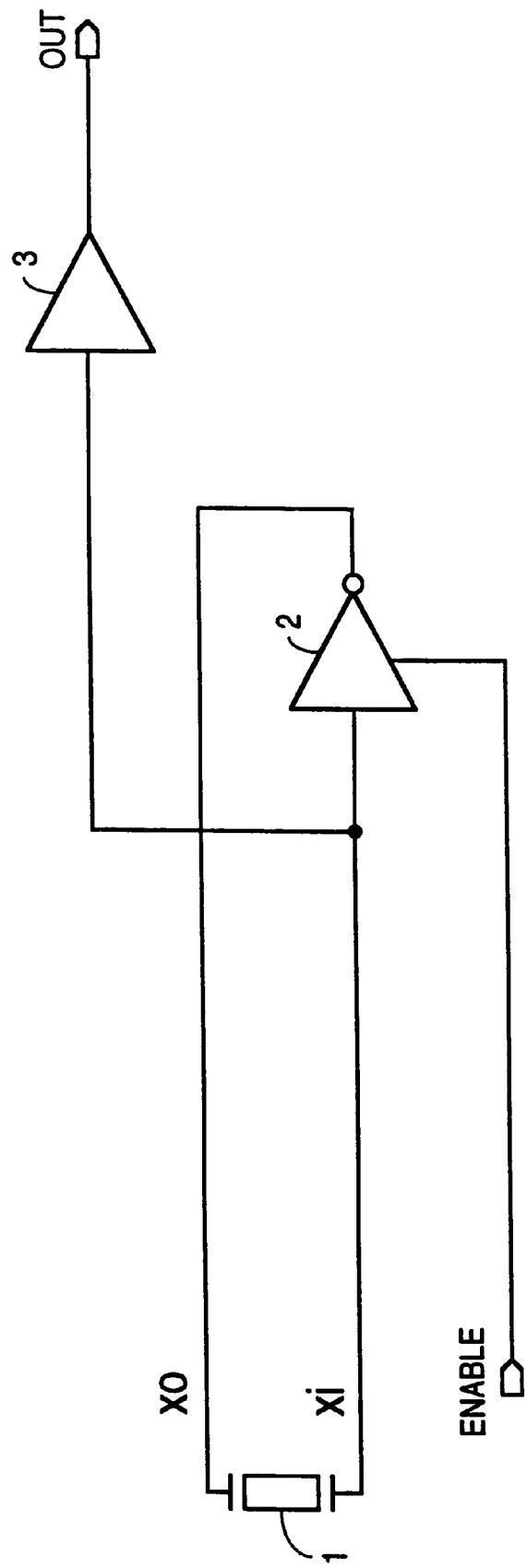
FIG. 1 illustrates an oscillator.

FIG. 1 illustrates a simple crystal oscillator without the frequency control of the present invention. The oscillator of FIG. 1 includes a resonator 1, an inverting amplifier 2, and a buffer 3 in a standard Pierce configuration. Specifically, the resonator 1 is connected between the input xi and the output xo of the inverting amplifier 2. The resonator may be a quartz crystal, for example, as is henceforth assumed in this description. Alternatively, the resonator may be a ceramic resonator, an LC circuit, or any other suitable type of resonator. Note that in an embodiment in which the crystal is replaced by an external clock, the output xo of the amplifier 2 does not need to be connected. The amplifier input xi is provided to the buffer 3. The output signal out of the buffer 3 is the output of the oscillator. The output may be used to drive a PLL. Signal ENABLE is applied to the amplifier 2 and can be used to enable or disable the oscillator.

Digital Frequency Control

Figure 2:
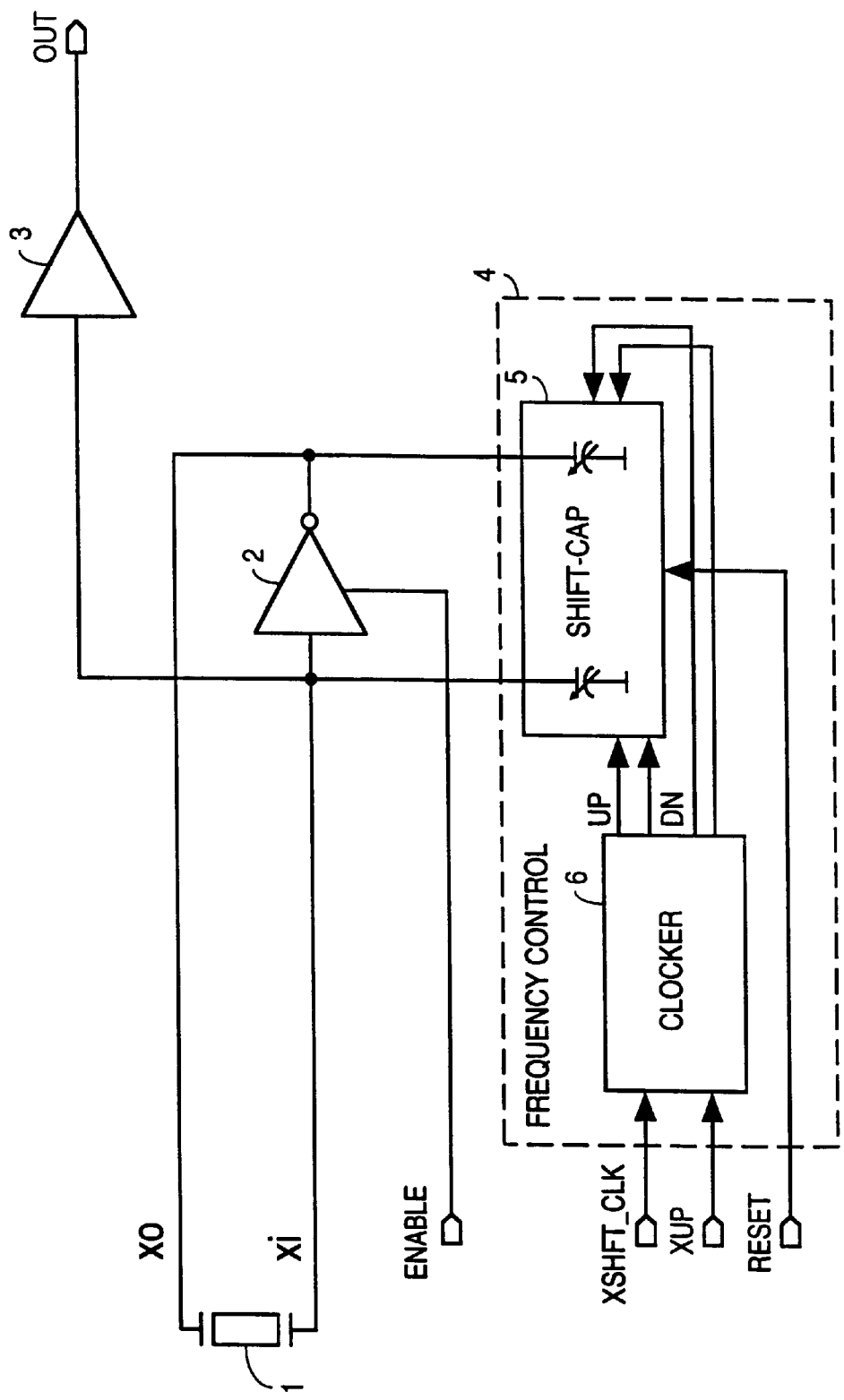
FIG. 2 illustrates an oscillator with digital frequency control.

FIG. 2 illustrates an oscillator identical to that illustrated in FIG. 1 but with the addition of digital frequency control of the present invention, i.e., the addition of frequency control circuit 4. Frequency control circuit 4 includes a shift register/variable capacitance ("shift-cap") block 5 and a clocker unit 6. Frequency adjustability is provided by a variable capacitance in the shift-cap block 5. The variable capacitance is in the form of two banks of switchable capacitors. The shift-cap block 5 also contains a shift register, which controls the switching (on/off) states of the capacitors. Each left shift of the shift register decreases the total capacitance of each bank by one variable capacitor (one ΔC), and each right shift increases the total capacitance of each bank by one ΔC. The clocker unit 6 provides clock signals UP and DN to the shift register in response to external inputs XSHFT_CLK and XUP to clock the shift register. Signals UP and DN each consist of a pair of complementary, non-overlapping clock signals, as will be discussed below. If XUP is high, XSHFT_CLK is used to generate pulses of UP. If XUP is low, XSHFT_CLK is used to generate pulses of DN. If XSHFT_CLK is held at one level, no UP or DN pulses are generated. Pulses of the UP signals are used to increase the output frequency of the oscillator (the frequency of signal OUT), while pulses of the DN signals are used to decrease the output frequency of the oscillator. Signal RESET is used to set the initial logic state of the shift register.

In general, the normalized oscillation frequency can be defined as $p=(\omega-\omega_m)/\omega_m$, where $\omega_m$ is the series resonant frequency of the crystal 1 and ω is the actual oscillation frequency of the entire oscillator. The value of ω(and, hence, the value of p) is controlled by circuit capacitance according to the formula $p=C/(2C_0+C_m)$. In the preceding formula, C is the capacitance associated with the motional arm of the crystal 1. The value of C is approximately 20 fF for the exemplary embodiment. Co is the crystal holder capacitance plus any other stray capacitance there may be between the xo and xi pins. The value of Co is estimated to be approximately 5 pF for the exemplary embodiment. Cx represents all capacitance from either xi or xo to AC ground.

Based on the above formulas, p varies from 770 ppm when Cx=16 pF to 480 ppm when Cx=32 pF. If the crystal has fm=24.576 MHz for the exemplary embodiment, then p=770 ppm corresponds to f=24.595 MHz, and p=480 ppm corresponds to f=24.588 MHz. The oscillation frequency, therefore, is controlled by varying Cx. Cx includes the variable capacitance in the shift-cap block 5, a 16 pF (in the exemplary embodiment) capacitor in the inverting amplifier 2, plus any stray capacitance.

Figure 3:
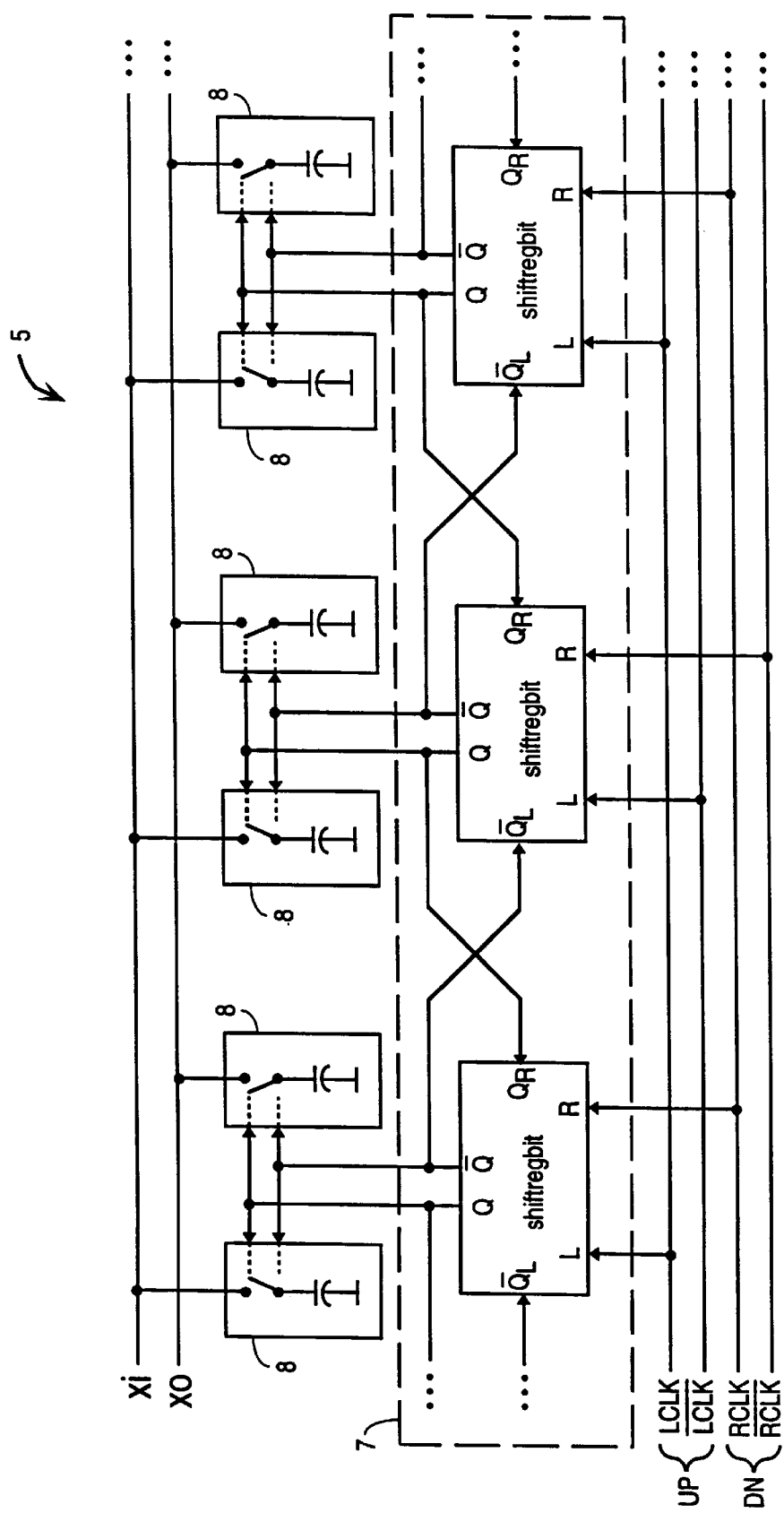
FIG. 3 illustrates the shift-cap block 5 of FIG. 2 in greater detail.

The variable capacitance in the shift-cap block 5 is an array of small capacitors that can be switched on or off by the shift register, as shown in FIG. 3. FIG. 3 shows three adjacent bits of the shift register 7 and the switchable capacitors 8 associated with those bits. In the exemplary embodiment, the shift register 7 has 128 bits. The state of each bit determines the on/off state of two capacitors 8, one connected between xi and supply voltage Vcc and the other connected between xo and Vcc. If a bit has Q=1, the capacitors to which it is connected are off (switch open). If the bit has Q=0, the capacitors to which it is connected are on (switch closed). Each bit has a $\overline{Q}_L$ input coupled to the $\overline{Q}$ output of the adjacent bit to the left and a $Q_R$ input coupled to the Q output of the adjacent bit to the right.

Each bit also has and L input and an R input. The L input receives either signal LCLK or $\overline{LCLK}$, depending on the bit's position in the shift register 7, while the R input receives either signal RCLK or $\overline{RCLK}$, also depending on the bit's position in the shift register 7. Specifically, alternate bits receive either LCLK and RCLK or $\overline{LCLK}$ and $\overline{RCLK}$, as shown in FIG. 3. LCLK, $\overline{LCLK}$, RCLK and $\overline{RCLK}$ are generated by the clocker unit 6 of FIG. 1. In FIG. 1, LCLK and $\overline{LCLK}$ together represent the UP signals in FIG. 2, because left shifts cause Cx to decrease and the output frequency to increase. RCLK and $\overline{RCLK}$ together represent the DN signals in FIG. 2, because right shifts cause Cx to increase and the output frequency to decrease. Each bit further has direct set ($\overline{S}_D$) and reset ($\overline{R}_D$) inputs (not shown in FIG. 3), which are driven by the RESET signal.

Figure 4:
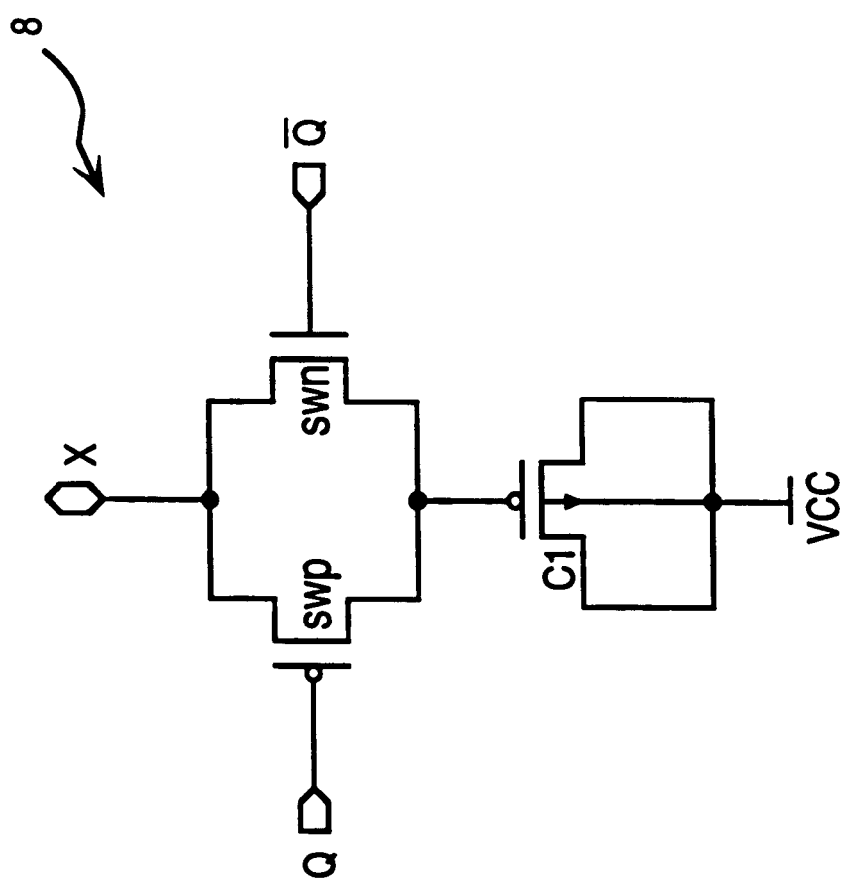
FIG. 4 illustrates a switchable capacitor 8.

FIG. 4 illustrates a schematic diagram of an exemplary one of the switchable capacitors 8. Each switchable capacitor 8 includes an n-channel Metal-Oxide Semiconductor Field-Effect Transistor (n-channel MOSFET, or NFET) swn with its source-to-drain path connected in parallel with that of a p-channel MOSFET (PFET) swp between signal xi or signal xo and the gate of a second PFET C1. The gate of transistor swn is coupled to the $\overline{Q}$ output of the associated shift register bit, while the gate of transistor swp is connected to the Q output. The source, drain, and substrate of transistor C1 are all coupled to Vcc.

Figure 5:
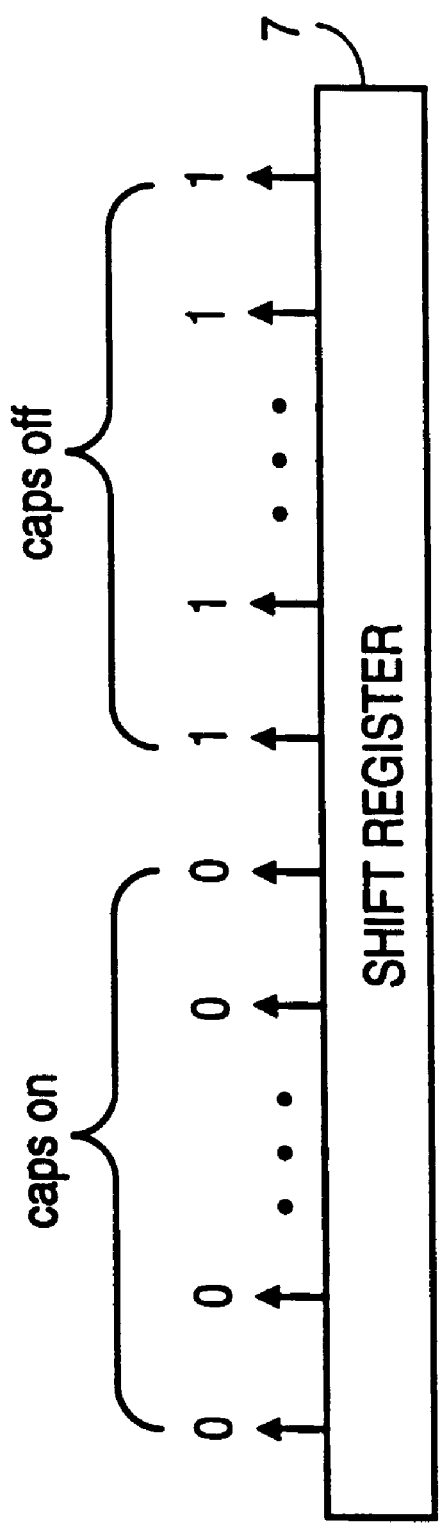
FIG. 5 illustrates the initial bit settings of the shift register 7 at RESET.

Upon assertion of the RESET signal, the shift register 7 is preset by the direct inputs to a state which sets the variable capacitance in the middle of its range. Specifically, as shown in FIG. 5, the left half of the shift register 7 is set to all logic 0s and the right half is set to all logic 1s. Thereafter, every change in the state of LCLK shifts the shift register 7 left by one bit, thereby decreasing Cx by one ΔC and increasing the output frequency, where ΔC is the value of the gate capacitance of transistor C1 in FIG. 4. Every change in the state of RCLK shifts the shift register 7 right by one bit, thus increasing Cx by one ΔC and decreasing the output frequency.

Figure 6:
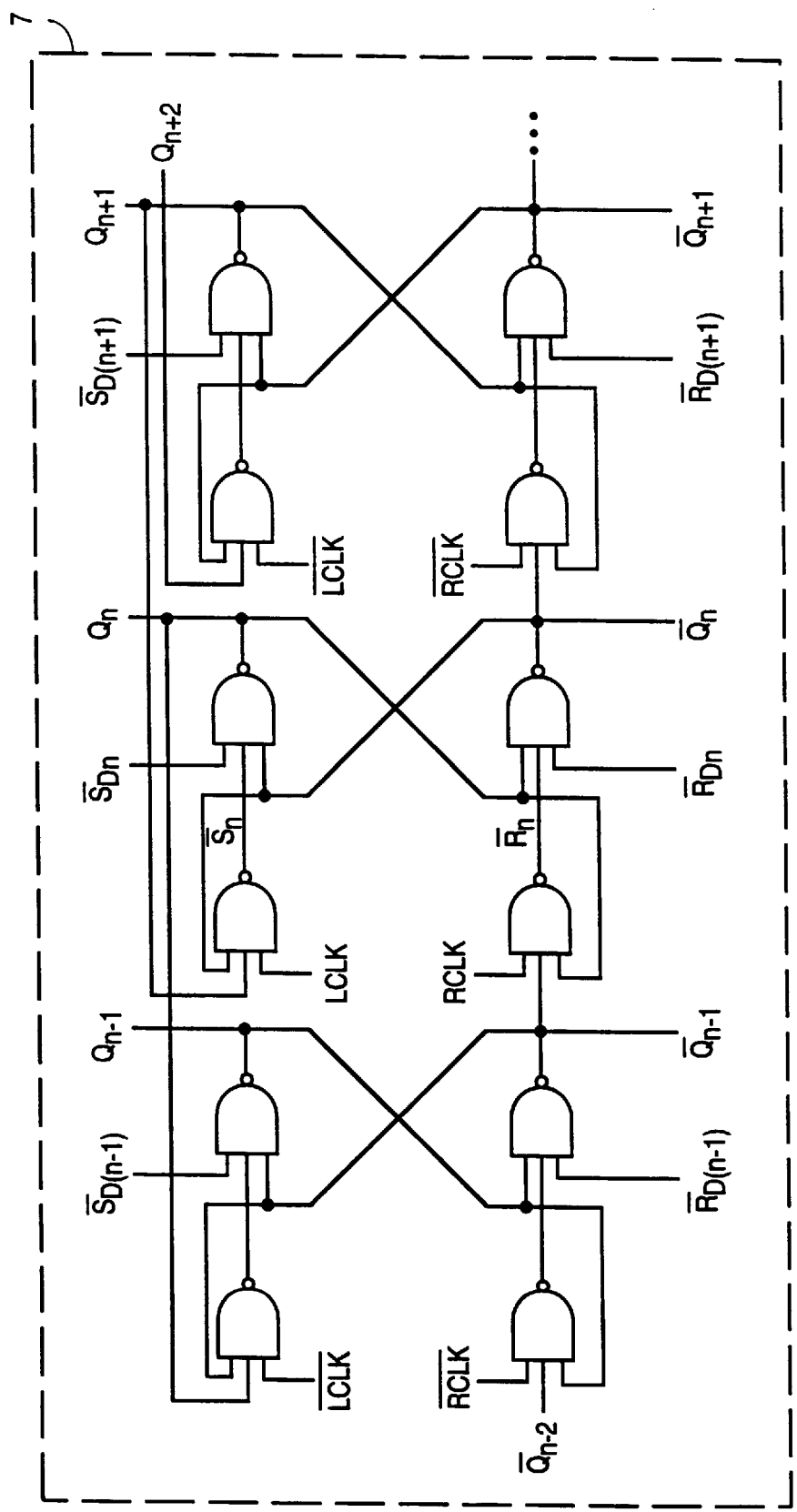
FIG. 6 illustrates the logic associated with three adjacent bits of the shift register 7.

FIG. 6 shows the shift register logic for three adjacent bits. As shown, alternate bits are clocked by LCLK and $\overline{LCLK}$, and by RCLK and $\overline{RCLK}$, as noted above. LCLK and $\overline{LCLK}$ are non-overlapping, as are RCLK and $\overline{RCLK}$. Also shown in FIG. 6 are the direct inputs $\overline{S}_D$ and $\overline{R}_D$, which are driven by the RESET signal shown in FIG. 2. Pulling $\overline{S}_D$ low causes Q of that bit to go high, while pulling $\overline{R}_D$ low causes Q to go low. Pulling either $\overline{R}_D$ or $\overline{S}_D$ high causes nothing to happen; the bit retain its value. Thus, for each of the leftmost half of the bits of the shift register 7, the $\overline{S}_D$ input is tied to Vcc, and the $\overline{R}_D$ input is tied to the inverted form of the RESET signal, which is an active high signal. For each of the rightmost half of the bits of the shift register 7, the $\overline{R}_D$ input is tied to Vcc, and the $\overline{S}_D$ input is tied to the inverted form of the RESET signal.

The operation of the shift register logic will now be described. First, assume all of the direct inputs to be at logic high, so that these inputs will have no effect on the circuit. Now consider just the middle bit, $Q_n$, of the three illustrated bits. The latch for the middle bit has $\overline{S}_n = \overline{Q}_n \cdot Q_{n+1} \cdot \text{LCLK}$ and $\overline{R}_n = \overline{Q}_{n-1} \cdot Q_n \cdot \text{RCLK}$. If LCLK and RCLK are both low, then $S_n$ and $R_n$ are both deasserted ($\overline{S}_n$ and $\overline{R}_n$ are both high), and the latch just holds its value. Now suppose LCLK goes high, as when performing a left shift. If $Q_{n+1}$ is 0, LCLK being high has no effect. LCLK being high also has no effect if $Q_n$ is 1. LCLK has no effect unless $Q_n$ is 0 and $Q_{n+1}$ is 1. In that case, LCLK being high produces $S_{n=1}$, which changes $Q_n$ to 1. In other words, the only bit which responds to LCLK going high is the bit whose current value is 0 and whose adjacent bit to the right is 1. In that event, the responding bit changes its current value to 1. In that case, LCLK can be left high if no further left shift is desired. No bit responds to LCLK being left high, because the only bit whose current value is 0 and whose neighboring bit to the right is 1 is $Q_{n-1}$, and its L input is $\overline{\text{LCLK}}$, which is low at this time. On the other hand, if another left shift is desired, LCLK is toggled from high to low. As a result, $\overline{\text{LCLK}}$ goes high, and $Q_{n-1}$ changes from 0 to 1. $Q_{n-2}$ (not shown) does not change in that case, because $Q_{n-2}$ is controlled by LCLK, which is 0.

The logic for a right shift is similar to that described above. The only bit which responds to RCLK going high is the bit whose current value is 1 and whose adjacent bit to the left is 0. In that event, the responding bit changes its current value to 0.

LCLK and RCLK are generated by the clocker unit 6 FIG. 2. The clocker unit 6 converts XSHFT_CLK into a pair of non-overlapping clock pulses, i.e., LCLK and $\overline{\text{LCLK}}$ if XUP is high, and RCLK and $\overline{\text{RCLK}}$ if XUP is low. If the UP signals are toggling, both DN signals are low. If the DN signals are toggling, both UP signals are low. Note that LCLK and $\overline{\text{LCLK}}$ should never be high at the same time, so that a left shift does not propagate uncontrolled. Similarly, it is important that RCLK and $\overline{\text{RCLK}}$ never be high at the same time. The outputs UP and DN of the clocker unit 6 are derived from, and have the same frequency as, its XSHFT_CLK input. To not shift the shift register 7 at all, XSHFT_CLK is simply stopped.

Figure 7:
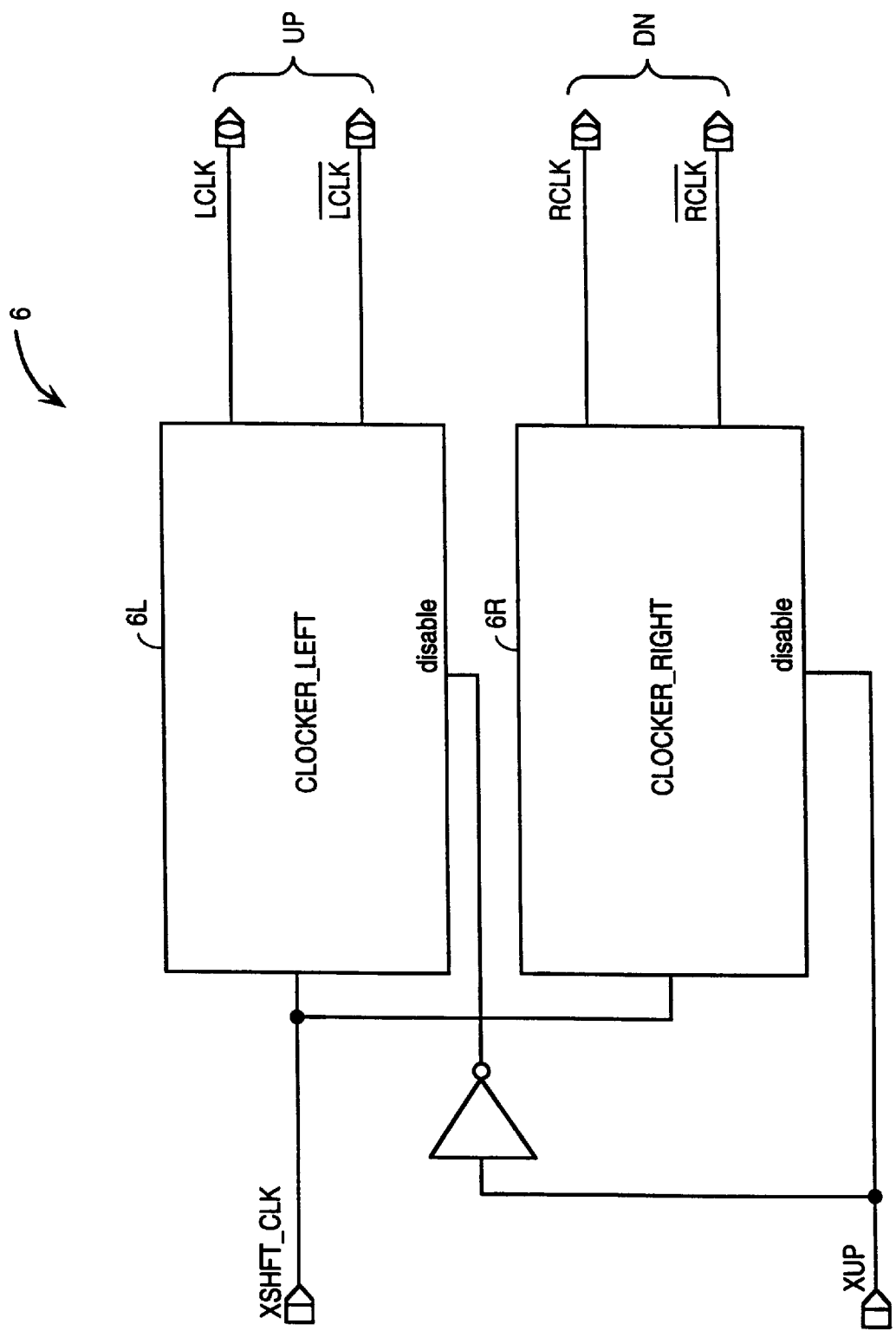
FIG. 7 illustrates the clocker unit 6 of FIG. 2 in greater detail.

FIG. 7 illustrates the clocker unit 6 in greater detail. The clocker unit 6 includes a left segment 6L for generating signals LCLK and $\overline{\text{LCLK}}$ and a right segment 6R for generating signals RCLK and $\overline{\text{RCLK}}$. Segments 6L and 6R each receive the input signal XSHFT_CLK as input. Segments 6L and 6R each have a disable input which, when asserted, prevents the segment from generating any output pulses. The disable input of the right segment 6R receives signal XUP, and the disable input of the left segment receives the inverted form of signal XUP, as illustrated, so that only one of the two segments 6L and 6R is enabled at a time.

Figure 8:
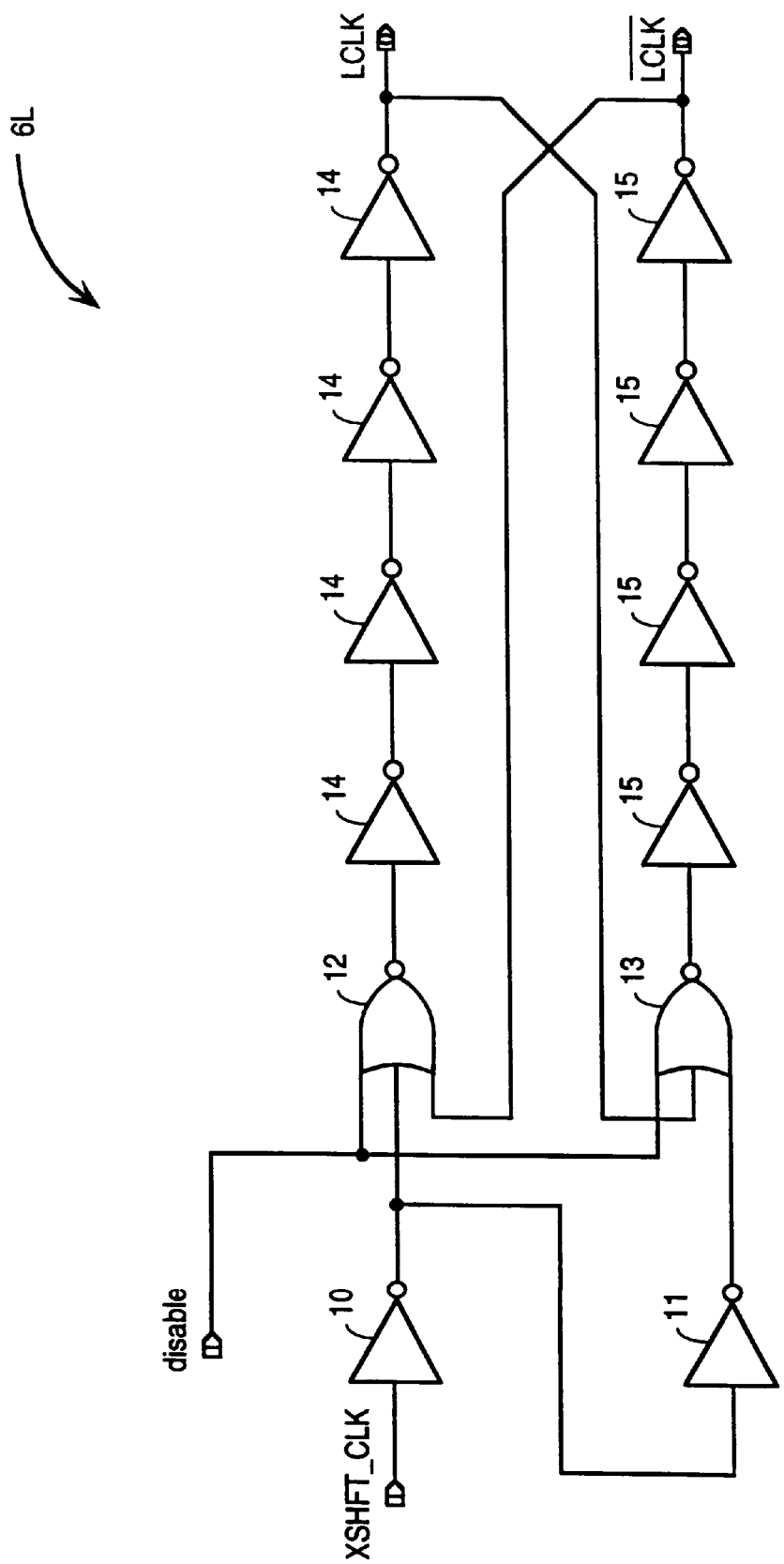
FIG. 8 illustrates one of the clocker segments 6L of FIG. 7 in greater detail.

FIG. 8 illustrates the left segment 6L in greater detail. The right segment 6R is identical to left segment 6L, except for the names of its output signals, and is therefore not illustrated at this level of detail. As shown, signal XSHFT_CLK is input to an inverter 10, the output of which is provided to a NOR gate 12 and to a second inverter 11. The NOR gate 12 also receives as input the signal applied to the disable input and the output signal LCLK. The output of the NOR gate 12 is applied to a delay line formed by a series of inverters 14, the final output of which forms signal LCLK. The output of the second inverter 11 is applied to a second NOR gate 13, which also receives as input the signal applied to the disable input and the output signal $\overline{\text{LCLK}}$. The output of NOR gate 13 is applied to a second delay line formed by a series of inverters 15, the final output of which forms signal $\overline{\text{LCLK}}$. Thus, if XSHFT_CLK is static, the enabled one of segments 6L and 6R has a 1 on one of its outputs and a 0 on the other output. If XSHFT_CLK is a rectangular waveform, the outputs LCLK and $\overline{\text{LCLK}}$ are complementary, non-overlapping rectangular waveforms.

It will be recognized that there are numerous other ways of implementing the clocker unit 6 and other elements of the present invention. For example, the number of inverters 14 or 15 used to form the delay lines may easily be altered to suit the intended application.

Automatic Gain Control

Figure 9:
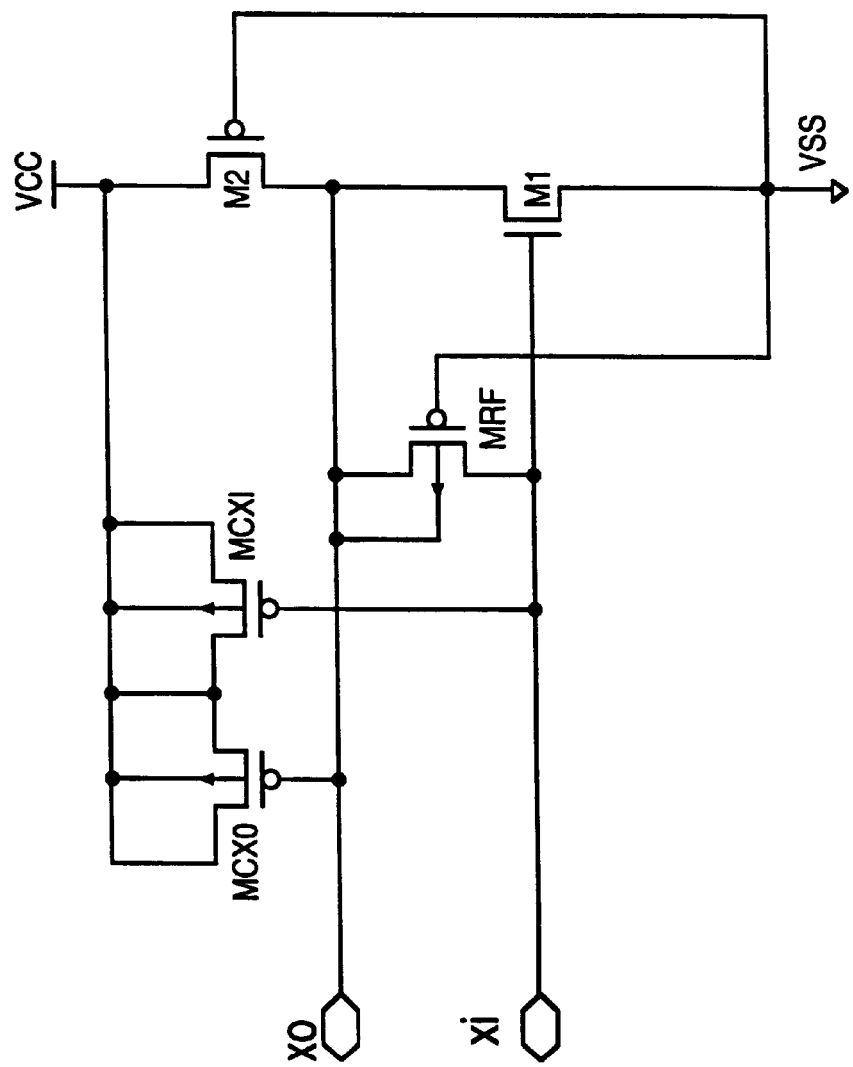
FIG. 9 illustrates the inverting amplifier 2 of FIGS. 1 and 2.

FIG. 9 illustrates the inverting amplifier 2 of FIGS. 1 and 2, according to one embodiment. As shown, the amplifier 2 also includes no gain control. The amplifier 2 includes an NFET M1 and PFETs M2, MRF, MCXI, and MCXO. The source of transistor M1 is connected to supply voltage Vss, while the source of transistor M2 is connected to supply voltage Vcc. The drains of transistors M1 and M2 are connected to each other. The gate of transistor M1 is connected to the input xi of the amplifier 2, while the gate of transistor M2 is tied to Vss. Output xo is connected to the drains of transistors M1 and M2. The amplifier 2 of FIG. 2 is held in its active or transition region by the feedback resistor formed by transistor MRF. Transistor MRF is connected with one of its source/drain contacts connected to the input xi and the other source/drain contact connected to the output xo. The gate of transistor MRF is connected to Vss, and the substrate of MRF is connected to the output xo. Transistors MCXI and MCXO form capacitors that are part of the load capacitance for the crystal. Transistors MCXI and MCXO are connected with their sources, drains, and substrates all coupled to Vcc. The gate of transistor MCXI is coupled to the input xi, and the gate of transistor MCXO is coupled to the output xo.

Figure 10:
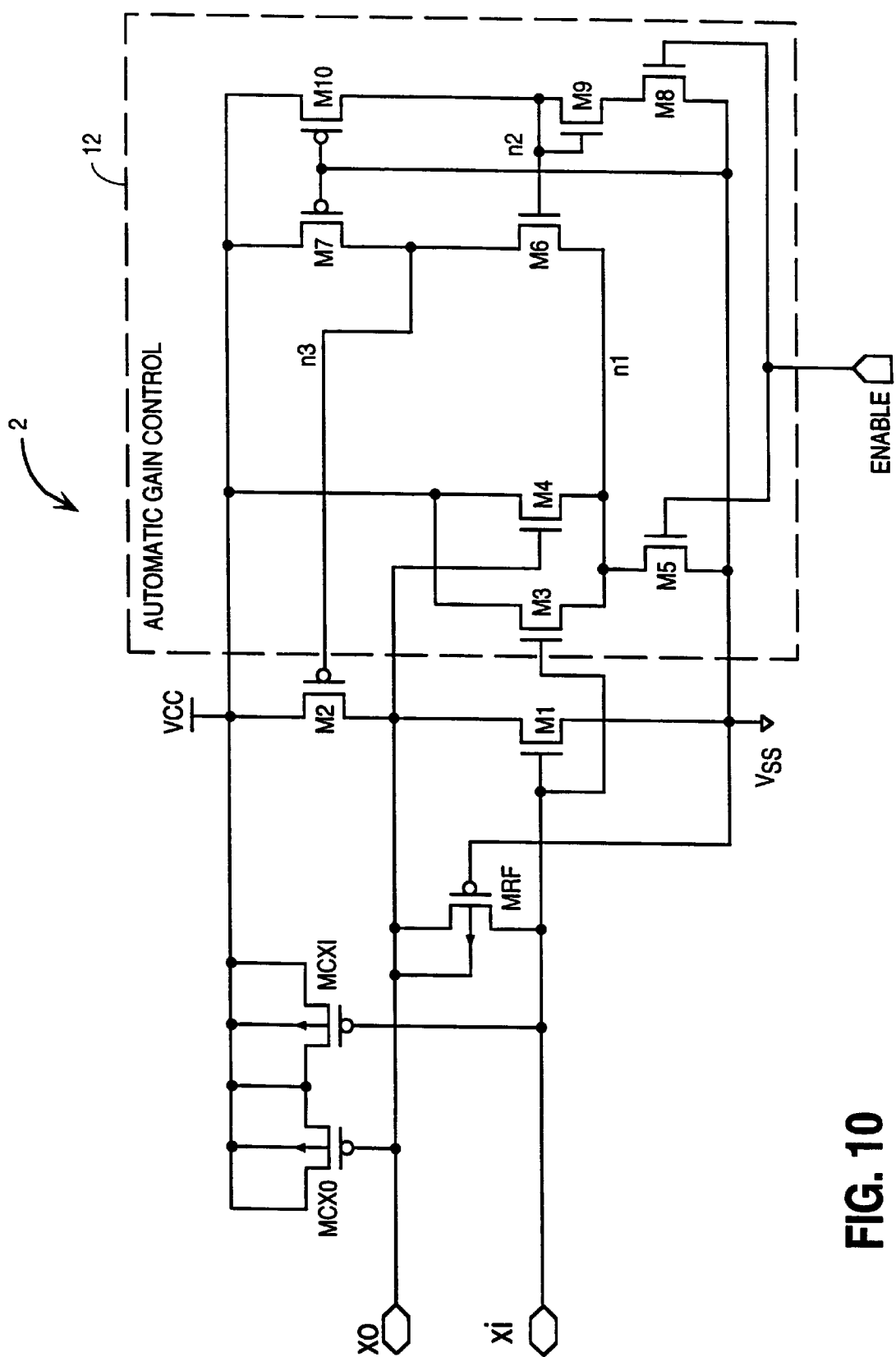
FIG. 10 illustrates the oscillation circuit of FIGS. 1 and 2 with automatic gain control.

FIG. 10 illustrates the oscillation circuit of FIG. 2 with the addition of an automatic gain control circuit 12 of the present invention. Note that the automatic gain control may be used in combination with the digital frequency control described above, although these two features can also be used separately. The automatic gain control circuit 12 of the present invention provides the oscillator with excess gain when the oscillator is first powered up, before oscillation begins. However, when the circuit begins to oscillate, the automatic gain control circuit 12 detects the oscillation build-up and decreases the gain to a level that supports peak-to-peak amplitude of, in the exemplary embodiment, approximately ⅓ the supply voltage.

As shown, the automatic gain control circuit 12 includes transistors M3 through M10. NFETs M3, M4, and M5 form an oscillation amplitude detector. NFET M6 is a common-gate amplifier which provides feedback to the basic inverting amplifier formed by M1 and M2. PFET M7 forms a load for M6, while PFET M10 and NFETs M8 and M9 provide biasing for M6.

Transistor M3 and M4 are source followers which use transistor M5 as a resistive load. In the exemplary embodiment, transistor M5 has a value of approximately 30 kΩ. Transistor M3 and M4 are connected with their source-to-drain paths in parallel between Vcc and a node n1. Specifically, the drains of transistors M3 and M4 are connected to each other and to Vcc. The sources of transistors M3 and M4 are connected to each other and to node n1. Transistor M5 has its drain connected to node n1 and its source connected to Vss. The gate of transistor M3 is coupled to the input xi, while the gate of transistor M4 is coupled to the output xo. The gate of transistor M5 is coupled to the ENABLE signal. Transistor M6 has its source connected to node n1 and its drain connected to node n3, which is the gate of transistor M2. The gate of transistor M6 is node n2. Transistor M7 has its source connected to Vcc, its drain connected to node n3, and its gate connected to Vss. Transistor M8 has its source connected to Vss and its drain connected to the source of transistor M9. Transistor M9 has its drain connected to node n2 and Vss. The gate of transistor M8 is connected to the ENABLE signal, while the gate of transistor M9 is connected to node n2. Transistor M10 has its source connected to Vcc, its drain connected to node n2, and its gate coupled to Vss.

When ENABLE is low, all current paths are turned off, such that the oscillator does not operate. When ENABLE is high, the oscillator can operate normally. When ENABLE is first asserted, in the absence of oscillation, the xo and xi pins are at approximately 1.1 VDC, and the sources of transistors M3 and M4 are at approximately 0.4 V, for the exemplary embodiment in which Vcc equals 3.3 V and Vss is ground (0 V). As oscillations build, transistor M4 conducts the positive half of its gate signal onto transistor M5, thus operating essentially as a half-wave rectifier. Transistor M3 does the same with its gate signal. Since the two gate signals are inverse of each other, the resultant waveform on transistor M5 appears, at least initially, as a full-wave rectified sinusoid with its base at approximately 0.4 V and its peaks growing with the oscillations. The increasing amplitude of this full-wave rectified signal results in a rising DC voltage at node n1.

As noted above, transistor M6 is a common-gate amplifier. The gain of transistor M6 is less than one at the oscillation frequency, and approximately +3 or +4 at 0 Hz in the exemplary embodiment. Transistor M6 amplifies the rising DC voltage at node n1 to produce a rising DC voltage at node n3. The rise in the DC voltage at node n3 decreases the drive on the gate of transistor M2, which reduces the current through the source-to-drain path of transistor M1. The reduction in the current available to transistor M1 lowers the gain of transistor M1, limiting the amplitude of the oscillations. In addition, when the circuit is oscillating, transistor MRF pumps a charge through its drain/substrate junction, which reduces the voltage at the input xi by approximately 0.5 VDC in the exemplary embodiment. This effect further reduces the drive level of transistor M1.

Figure 12:
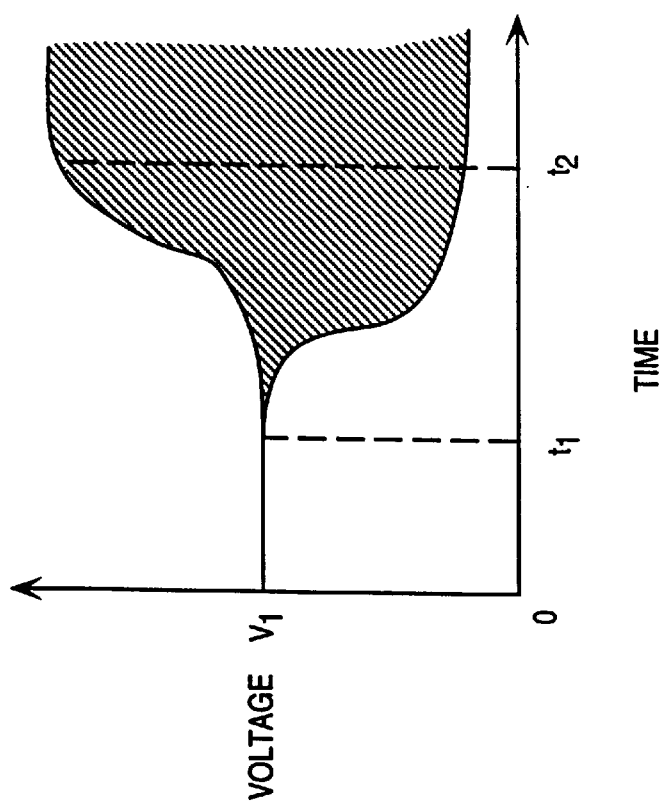
FIGS. 11 through 14 illustrate exemplary waveforms that occur at power-up of the oscillator when using gain control.
Figure 11:
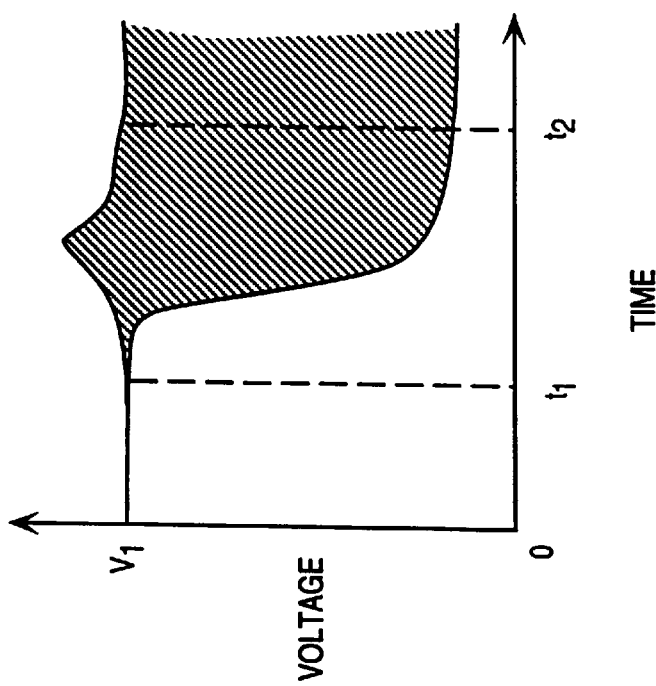
Figure 14:
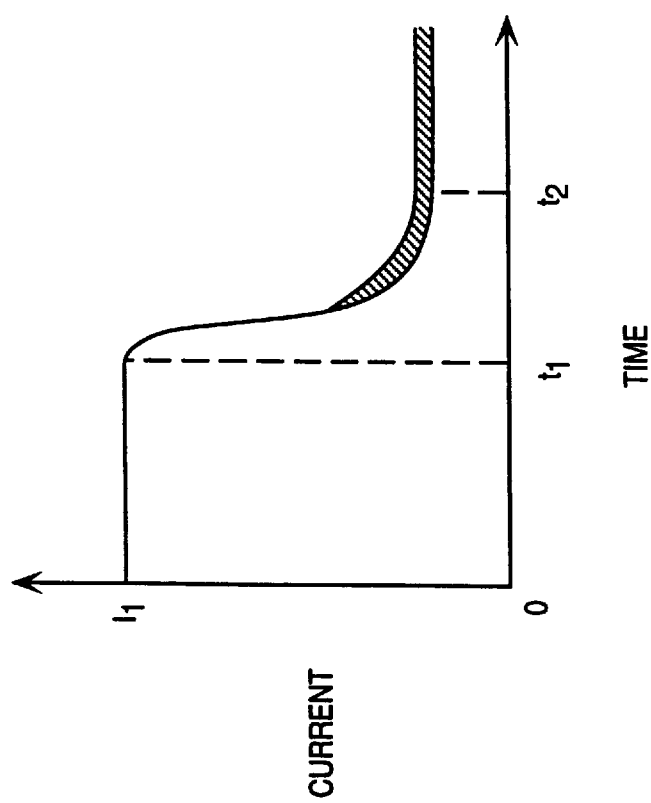
Figure 13:
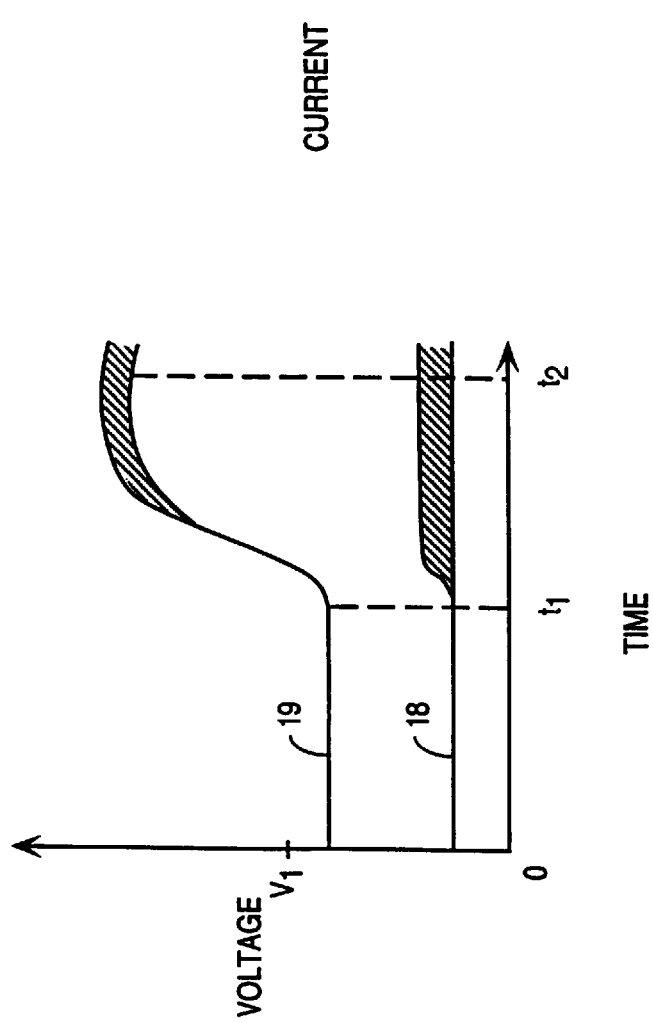

FIGS. 11 through 14 illustrate exemplary waveforms that occur at power-up of the oscillator when using gain control according to the present invention. Specifically, FIG. 11 illustrates the voltage at the input xi, and FIG. 12 illustrates the voltage at the output xo on linear scales. FIG. 13 illustrates the signals at nodes n1 and n3 (curves 18 and 19, respectively), while FIG. 14 illustrates a waveform representing the source current of transistor M2, both on linear scales. The shaded regions in these figures represent oscillations of the illustrated waveforms. Oscillations begin at approximately time $t_1$ and reach their steady-state amplitude at approximately time $t_2$. When oscillations begin at time $t_1$, the voltage at both xi and xo is $V_1$, which is approximately 1.1 V in the exemplary embodiment. When oscillations begin, the DC voltage at node n1 begins to increase, as do its AC components. The voltage at node n1 is amplified by transistor M6; however, the amplification factor is less than one for the AC components and greater than one for the DC component. The DC voltage at node n3 then increases by approximately 1 V in the exemplary embodiment. In the exemplary embodiment, the approximately 1 V increase in voltage at node n3 reduces the source current in transistor M2 from approximately 1 mA ($I_1$) to approximately 200 µA. As a result, the oscillation build-up is self-limited at approximately 1 V peak-to-peak.

Note the effect of the charge pumping across the drain/substrate junction of MRF is to lower the DC voltage of xi from its initial value of 1.1 V to approximately 0.6 V in the exemplary embodiment. This effect contributes to the reduction in the source current of M2; however, most of the reduction in current is caused by M6.

Figure 15:
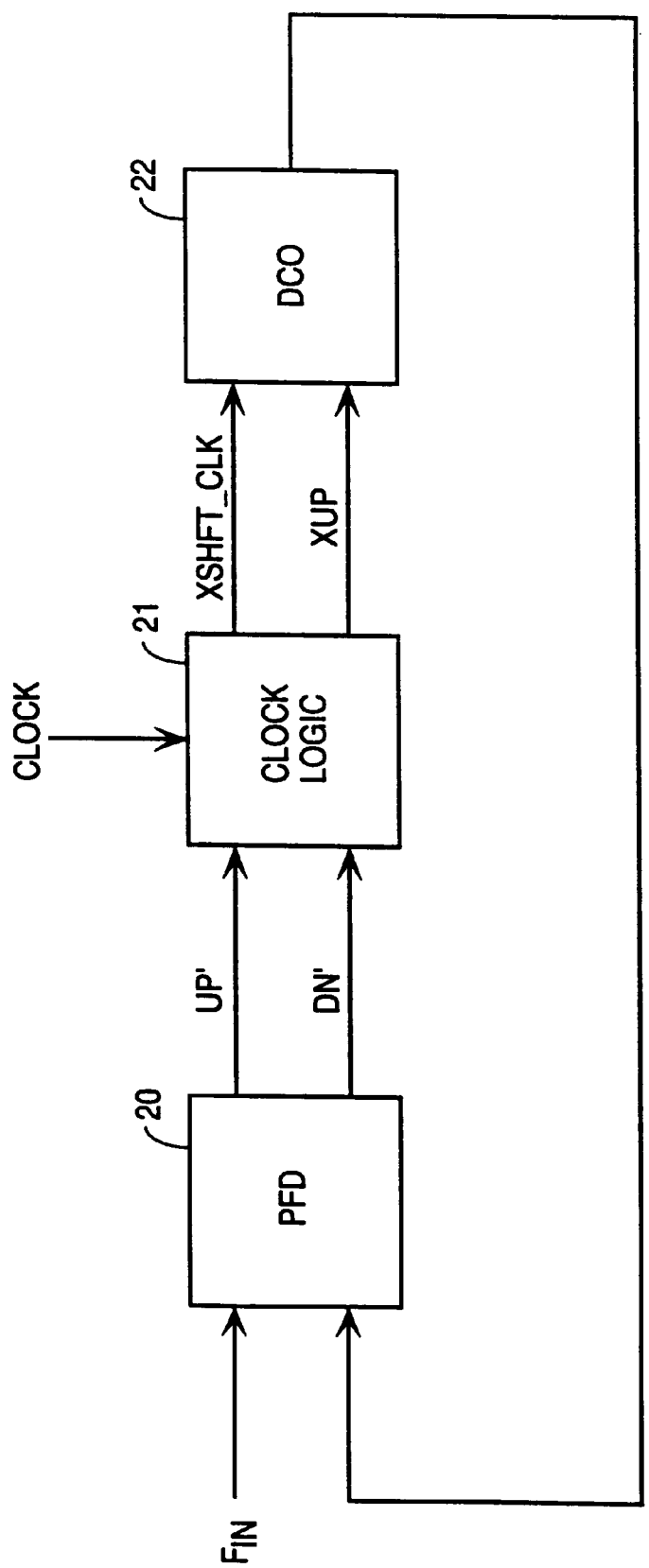
FIG. 15 illustrates an example of a PLL circuit in which an oscillator can be used.

An oscillator such as described herein be used in many types of applications, including applications which require virtually any type of clock signal. For example, such an oscillator may be used as a digitally controlled oscillator (DCO) in a phase-locked loop (PLL) circuit. FIG. 15 illustrates an example of such a circuit. The PLL circuit of FIG. 15 includes a conventional phase and frequency detector (PFD) 20, a clock logic block 21, and a DCO 22. The PFD 20 receives a reference frequency $F_{IN}$ as input and outputs signals UP' and DN' to the clock logic block 21. The clock logic block 21 also receives as input a clock signal CLOCK and outputs signals XSHFT_CLK and XUP (described above) to the DCO 22. The output of the DCO 22 is provided as an input to the PFD 20.

The operation of the PLL circuit is as follows, for one embodiment. Assertion of signal UP' causes the DCO 22 to increase its oscillation frequency. More specifically, assertion of UP' causes the internal logic of clock logic block 21 to generate signals XSHFT_CLK and XUP in such a manner as to increase the number N of logic ones in the shift register 7 of shift-cap block 5. Assertion of signal DN' causes the DCO 22 to decrease its oscillation frequency. More specifically, assertion of DN' causes logic in the clock logic block 21 to generate signals XSHFT_CLK and XUP in such a manner as to decrease the number N of logic ones in the shift register 7 of shift-cap block 5. If neither UP' nor DN' is asserted, DCO 22 maintains its current frequency. Note that PPD 20 includes appropriate logic to prevent simultaneous assertion of UP' and DN'.

Figure 16:
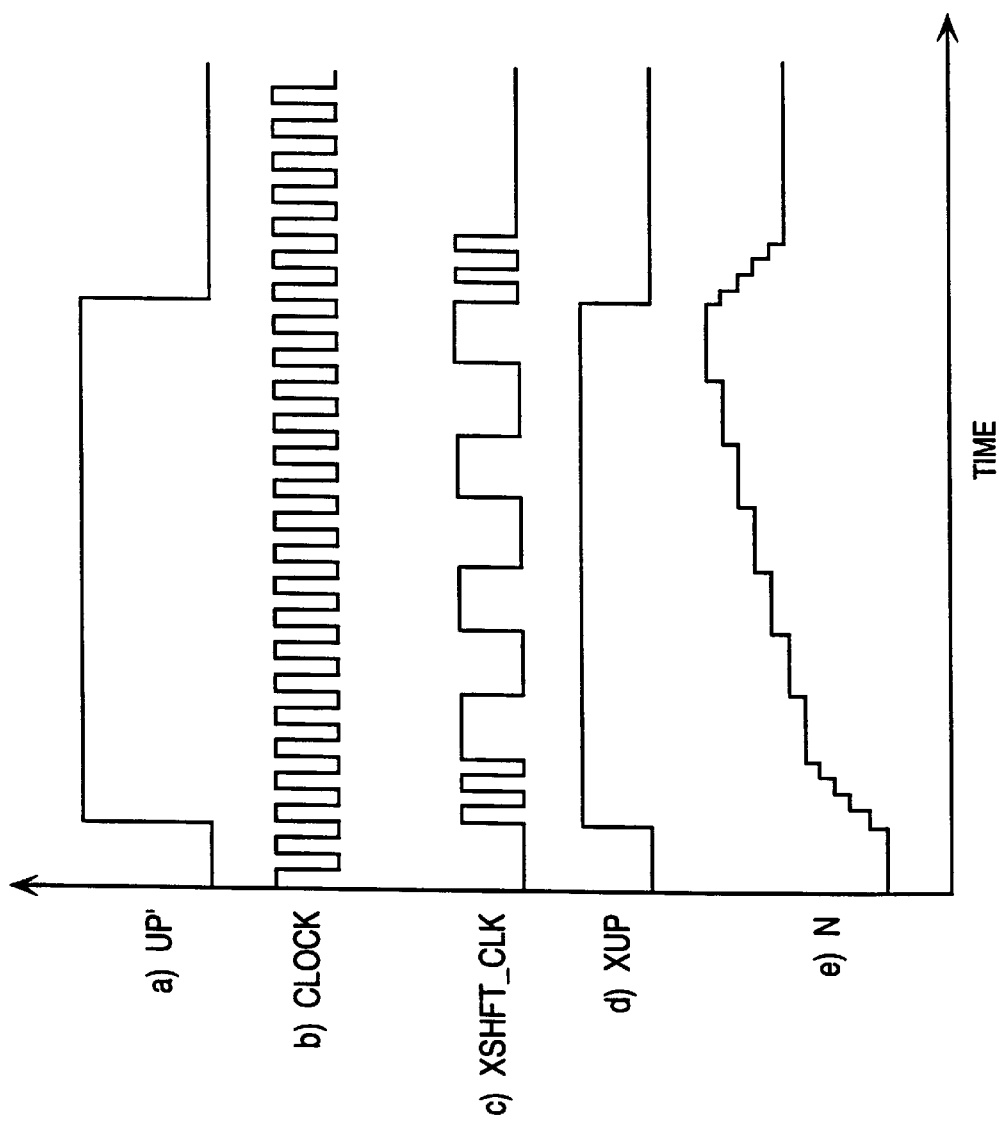
FIG. 16 is a timing diagram showing signals associated with the PLL circuit of FIG. 15.

FIG. 16 is a timing diagram showing signals UP' (a), CLOCK (b), XSHFT_CLK (c), XUP (d), and the number N of ones in the shift register (e), for one illustrative case. In the illustrated case, UP' is asserted to cause the DCO 22 to increase its frequency. As shown, XUP is asserted at the same time UP' is asserted and is deasserted at the same time UP' is deasserted. The number N of ones in the shift register 7 reaches its maximum just before UP' and XUP are deasserted. Following deassertion of UP' and XUP, the number N of ones in the shift register decreases, causing the oscillation frequency of the DCO 22 to decrease. Note that waveform (e), which represents the number N of ones in the shift register, approximates an exponential rise in response to assertion of UP' and XUP. This exponential approximation is accomplished, at least in part, by providing logic in clock logic block 21 to generate XSHFT_CLK at either of two different frequencies, as shown in FIG. 16.

Figure 17:
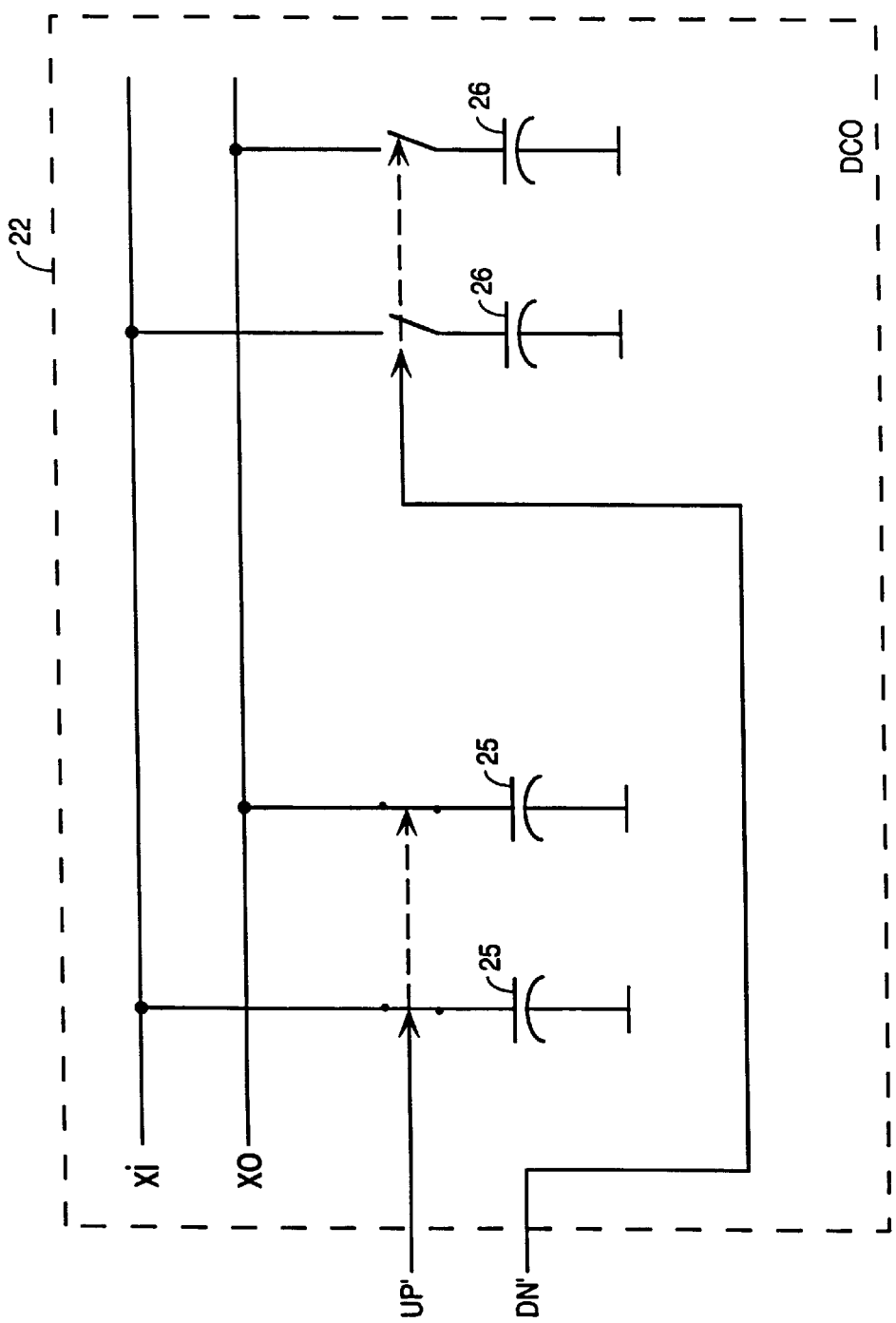
FIG. 17 shows an embodiment of a DCO, which includes four additional switchable capacitors outside the shift register, for use in a PLL.

In another embodiment of the PLL, the frequency of the DCO 22 is controlled by including four additional switchable capacitors in the DCO 22, as shown in FIG. 17. This embodiment does not require logic in the clock logic block 21 to provide XSHFT_CLK at two different frequencies. Two of the additional four capacitors are switchably connected to the input xi, while the other two are switchably connected to the output xo. Each of the four additional capacitors has a value several times larger than the switchable capacitors 8 of the switch-cap block 5. The four additional capacitors include two normally on (switch closed) capacitors 25 and two normally off (switch open) capacitors 26. One of each of capacitors 25 and 26 is connected to input xi and one of each of capacitors 25 and 26 to output xo. The switching state of the normally on capacitors 25 is controlled by signal UP', while the switching state of the normally off capacitors 26 is controlled by signal DN'. More specifically, when UP' from the PFD 20 is asserted, the normally on capacitors 25 are switched off. When UP' is deasserted, the normally on capacitors 25 are switched back on. When DN' from the PFD 20 is asserted, the normally off capacitors 26 are switched on. When DN' is deasserted, the normally off capacitors 25 are switched back off.

Figure 18:
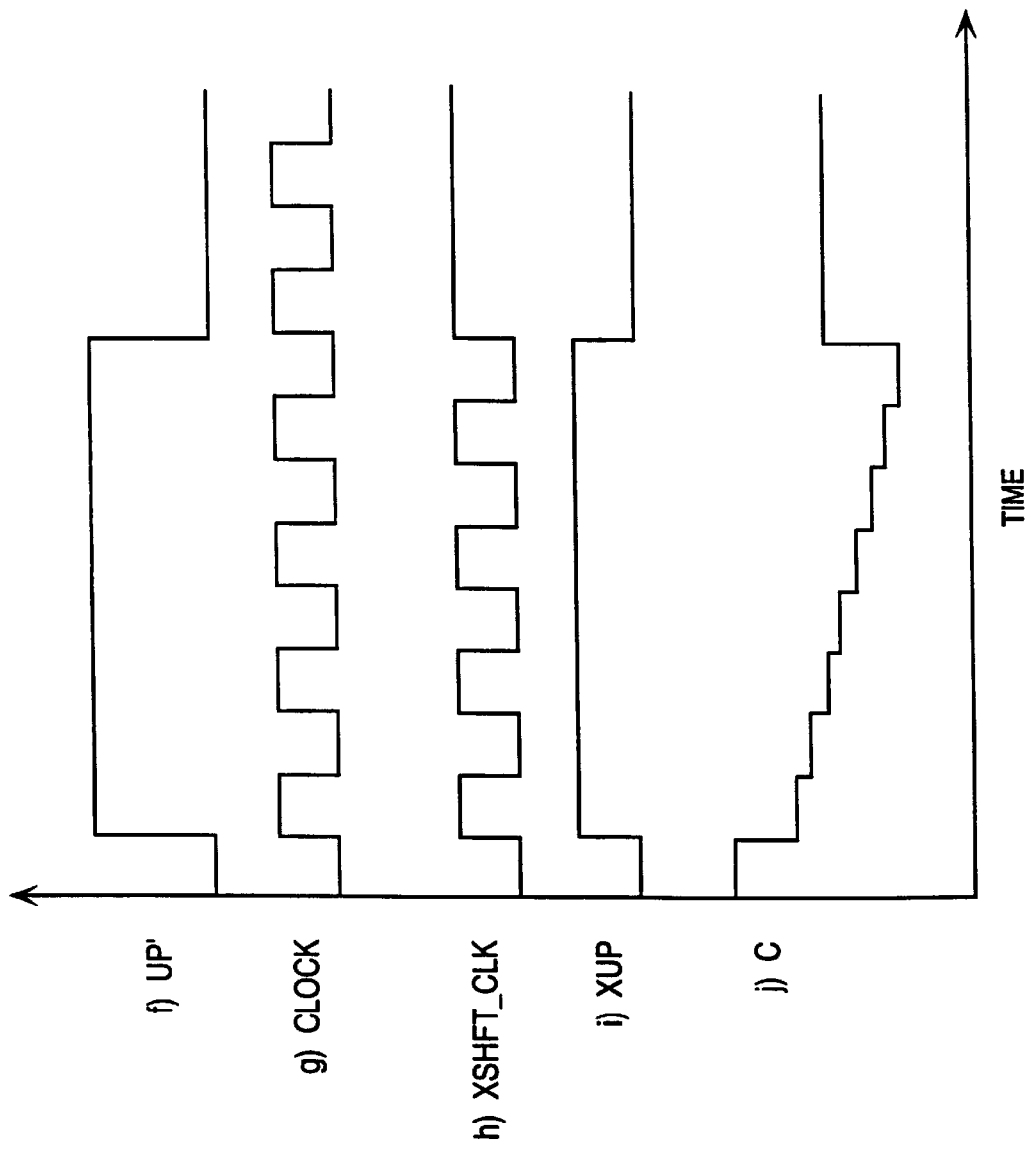
FIG. 18 is a timing diagram showing signals associated with the embodiment of FIG. 17.

FIG. 18 is a tiling diagram of signals UP' (f), CLOCK (g), XSHFT_CLK (h), XUP (i), and the total capacitance C provided by the shift-cap block 5 (j), for the illustrative case in which UP' is asserted and then deasserted. The capacitance C is illustrated in FIG. 18, rather than the number N of ones in the shift register, because in this embodiment, the capacitance is not determined solely by the value stored in the shift register, due to the addition of the four larger switched capacitors.

Thus, a technique for providing an oscillator with all-digital frequency control and automatic gain control has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative sense rather than a restrictive sense.

What is claimed is:

1. An oscillation circuit having an adjustable gain, the oscillation circuit comprising:
   a resonator having a first terminal and a second terminal;
   a first amplifier having an input coupled to the first terminal of the resonator and an output coupled to the second terminal of the resonator, the first amplifier for amplifying oscillations of the resonator according to a gain;
   an oscillation detector having a first input coupled to the first terminal of the resonator and a second input coupled to the second terminal of the resonator, the oscillation detector having an output and generating at the output a rectified periodic signal in response to oscillations of the resonator at the first and second terminals; and
   a second amplifier coupled to receive the output of the oscillation detector, the second amplifier providing feedback to the first amplifier based on the amplitude of the rectified periodic signal to limit the gain of the first amplifier.

2. An oscillation circuit according to claim 1, wherein the first amplifier comprises:
   a first transistor and a second transistor having conduction paths coupled in series between a first supply voltage and a second supply voltage, the first transistor having a control terminal coupled to a first terminal of the resonator, a second terminal of the resonator coupled to a node connecting the conduction paths of the first and second transistors; and
   a feedback resistance coupled between the control terminal of the first transistor and the second terminal of the resonator.

3. An oscillation circuit according to claim 2, wherein the oscillation detector comprises a third transistor, a fourth transistor, and a fifth transistor, the third transistor having a control terminal coupled to the first terminal of the resonator, the third and fifth transistors having conduction paths coupled in series between the first and second supply voltages, the conduction paths of the third and fifth transistors coupled at a first node, the fourth transistor having a control terminal coupled to the second terminal of the resonator and having a conduction path coupled between the second supply voltage and the first node.

4. An oscillation circuit according to claim 3, wherein the oscillation circuit further comprises a load resistance coupled to the second supply voltage, wherein the second amplifier comprises a sixth transistor having a control terminal coupled to a second node and having a conduction path coupled between the first node and the load resistance, a third node connecting the load resistance and the conduction path of the sixth transistor, the second transistor having a control terminal coupled to the third node.

5. An oscillation circuit according to claim 1, wherein the oscillation circuit generates an output at an oscillation frequency, the oscillation circuit further comprising:
   a variable capacitance coupled to at least one of the first terminal and the second terminal of the resonator; and
   a shift register coupled to the variable capacitance and operable to adjust the variable capacitance to adjust the oscillation frequency.

6. An oscillation circuit having an adjustable gain, the oscillation circuit comprising:
   a crystal;
   a resonator including:
      a first transistor and a second transistor having conduction paths coupled in series between a first supply voltage and a second supply voltage, the first transistor having a control terminal coupled to a first terminal of the crystal, a second terminal of the crystal coupled to a node connecting the conduction paths of the first and second transistors; and
      a feedback resistance coupled between the control terminal of the first transistor and the second terminal of the crystal; and
   a gain control circuit including:
      an oscillation detector including a third transistor, a fourth transistor, and a fifth transistor, the third transistor having a control terminal coupled to the first terminal of the crystal, the third and fifth transistors having conduction paths coupled in series between the first and second supply voltages, the conduction paths of the third and fifth transistors coupled at a first node, the fourth transistor having a control terminal coupled to the second terminal of the crystal and having a conduction path coupled between the second supply voltage and the first node;
      a load resistance coupled to the second supply voltage; and
      a sixth transistor having a control terminal coupled to a second node and having a conduction path coupled between the first node and a third node, the third node connecting the load resistance and the conduction path of the sixth transistor, the second transistor having a control terminal coupled to the third node; and a biasing circuit including the second node and coupled between the first and second supply voltages to bias the second node.

7. An oscillation circuit according to claim 6, further comprising:

a variable capacitance coupled to at least one of the first terminal and the second terminal of the crystal; and a shift register coupled to the variable capacitance and operable to adjust the variable capacitance to adjust the oscillation frequency.

8. An oscillation circuit having an adjustable gain, the oscillation circuit comprising:

a resonator having a first terminal and a second terminal;

a first amplifier having an input coupled to a first terminal of the resonator and an output coupled to a second terminal of the resonator, the first amplifier for amplifying oscillations of the resonator according to a gain;

an oscillation detector having a first input coupled to the first terminal of the resonator and a second input coupled to the second terminal of the resonator, the oscillation detector having a rectified output signal corresponding to the amplitude of the oscillations of the resonator at the first and second terminals; and a second amplifier coupled to receive the output of the oscillation detector, the second amplifier providing feedback to the first amplifier to adjust the gain of the first amplifier to maintain oscillations of the resonator at a reduced power level.

9. An oscillator comprising:

a first amplifier capable of being coupled to a resonator, the first amplifier for amplifying oscillations of the resonator according to a gain;

an oscillation detector coupled to the first amplifier, the oscillation detector outputting a detection signal in response to oscillations of the resonator, wherein said oscillation detector comprises a first transistor, a second transistor, and a third transistor, the first transistor having a control terminal coupled to a first terminal of the resonator, the first and third transistors having conduction paths coupled in series between a first supply voltage and a second supply voltage, the conduction paths of the first and third transistors coupled at a first node, the second transistor having a control terminal coupled to a second terminal of the resonator and having a conduction path coupled between the second supply voltage and the first node; and a second amplifier coupled to receive the detection signal, the second amplifier providing feedback to the first amplifier to control the gain based on a level of the detection signal, wherein said detection signal comprises a rectified periodic signal, and wherein the level of the rectified periodic signal corresponds to an amplitude of the oscillations of the resonator.

10. An oscillator according to claim 9, wherein the second amplifier comprises a common gate amplifier.

11. An oscillator comprising:

a first amplifier capable of being coupled to a resonator, the first amplifier for amplifying oscillations of the resonator according to a gain;

an oscillation detector coupled to the first amplifier, the oscillation detector outputting a detection signal in response to oscillations of the resonator;

a second amplifier coupled to receive the detection signal, the second amplifier providing feedback to the first amplifier to control the gain based on a level of the detection signal;

a variable capacitance coupled to the resonator; and a shift register coupled to the variable capacitance and operable to adjust the variable capacitance to adjust the oscillation frequency of the resonator.

12. An oscillator comprising:

first amplifier means for outputting an oscillating signal at a gain in response to oscillations of a resonator;

detection means for detecting the oscillating signal and for generating a detection signal in response thereto, the detection signal having a level corresponding to a level of the oscillating signal;

control means for controlling the gain based on the level of the detection signal; and varying means for varying a variable capacitance coupled to the resonator by serially transferring a set of bits to alter a logic state of the set of bits.

13. A method of controlling the gain and frequency of an oscillator, the method comprising:

generating an oscillating signal at a gain in response to oscillations of a resonator and at a frequency dependent upon a capacitance;

detecting the oscillating signal;

generating a detection signal in response to detecting the oscillating signal, the detection signal having a level corresponding to a level of the oscillating signal;

adjusting the gain as the level of the detection signal changes;

generating a set of bits, wherein the capacitance is dependent upon the logic states of the bits; and adjusting the frequency by serially shifting the set of bits to vary the capacitance.

* * * * *